US010480978B2

(12) United States Patent
Ono et al.

(10) Patent No.: US 10,480,978 B2
(45) Date of Patent: Nov. 19, 2019

(54) METHOD FOR INSPECTING FLOW RATE CONTROLLER AND METHOD FOR PROCESSING WORKPIECE

(71) Applicant: TOKYO ELECTRON LIMITED, Tokyo (JP)

(72) Inventors: Kumiko Ono, Tokyo (JP); Hiroshi Tsujimoto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/938,916

(22) Filed: Mar. 28, 2018

(65) Prior Publication Data

US 2018/0286721 A1   Oct. 4, 2018

(30) Foreign Application Priority Data

Mar. 30, 2017  (JP) ................. 2017-068162

(51) Int. Cl.
| | |
|---|---|
| *G06F 19/00* | (2018.01) |
| *G01F 1/86* | (2006.01) |
| *H01L 21/67* | (2006.01) |
| *G05D 7/06* | (2006.01) |
| *H01L 21/683* | (2006.01) |

(Continued)

(52) U.S. Cl.
CPC ............ *G01F 1/86* (2013.01); *G05D 7/0635* (2013.01); *H01J 37/32449* (2013.01); *H01L 21/67017* (2013.01); *H01L 21/67253* (2013.01); *H01L 21/67288* (2013.01); *H01L 21/6831* (2013.01); *G03F 7/091* (2013.01); *G03F 7/162* (2013.01); *G03F 7/2006* (2013.01)

(58) Field of Classification Search
CPC ................. G01F 1/86; H01L 21/67288; H01L 21/67017; H01L 21/67253; H01L 21/6831; H01J 37/32834; H01J 37/32449; G05D 7/0635; G03F 7/091; G03F 7/2006; G03F 7/162
See application file for complete search history.

(56) References Cited

U.S. PATENT DOCUMENTS 5,383,122 A * 1/1995 Ohaeri ..................... G06G 7/57
                                                              324/324
9,163,969 B2 * 10/2015 Sawada ...................... G01F 1/34
(Continued)

FOREIGN PATENT DOCUMENTS

JP            5286430 B2      9/2013

*Primary Examiner* — Michael D Masinick
(74) *Attorney, Agent, or Firm* — Studebaker & Brackett PC

(57) ABSTRACT

A method according to an aspect includes outputting gas continuously from a flow rate controller, closing a valve, obtaining a first pressure rise characteristic, outputting the gas intermittently from the flow rate controller, closing the valve, obtaining a second pressure rise characteristic, obtaining a third pressure rise characteristic, obtaining a fourth pressure rise characteristic, obtaining a first required time required from the third pressure rise characteristic, obtaining a second required time from the fourth pressure rise characteristic, obtaining an estimated time until a predetermined pressure is reached, in a case where the intermittent output of the gas is performed assuming that there is no delay time, and obtaining a parameter representing a difference between the estimated time and the second required time.

9 Claims, 11 Drawing Sheets

(51) Int. Cl.
*H01J 37/32* (2006.01)
*G03F 7/16* (2006.01)
*G03F 7/20* (2006.01)
*G03F 7/09* (2006.01)

(56) References Cited

U.S. PATENT DOCUMENTS

| | | | |
|---|---|---|---|
| 9,638,560 B2* | 5/2017 | Nagase | G01F 1/34 |
| 2001/0004903 A1* | 6/2001 | Ohmi | G05D 7/0658 |
| | | | 137/613 |
| 2006/0076060 A1* | 4/2006 | Ohmi | G05D 7/0635 |
| | | | 137/334 |
| 2013/0186471 A1* | 7/2013 | Nagase | G01F 1/34 |
| | | | 137/2 |
| 2014/0013838 A1* | 1/2014 | Sawada | G01F 1/34 |
| | | | 73/203 |

* cited by examiner

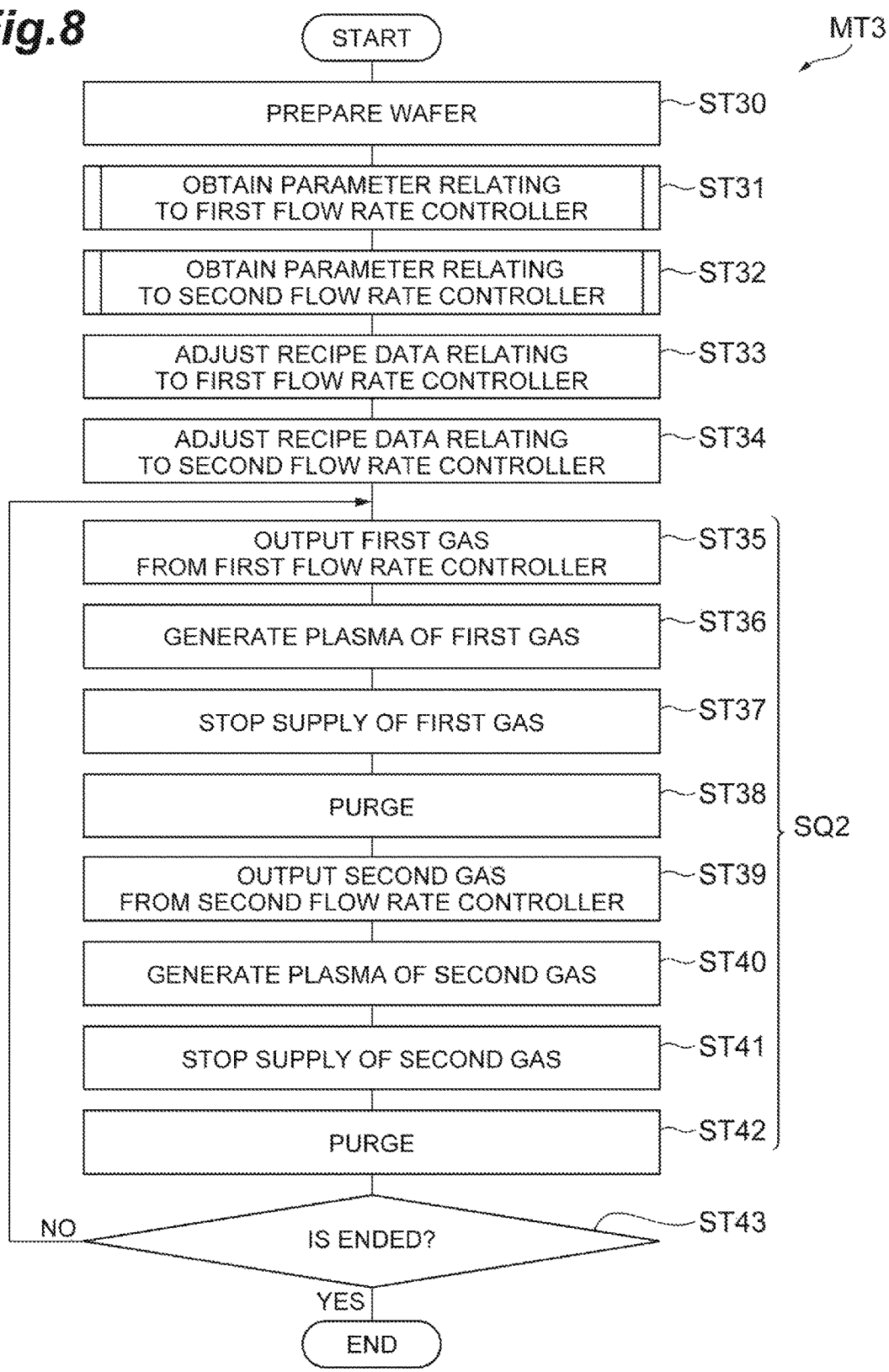

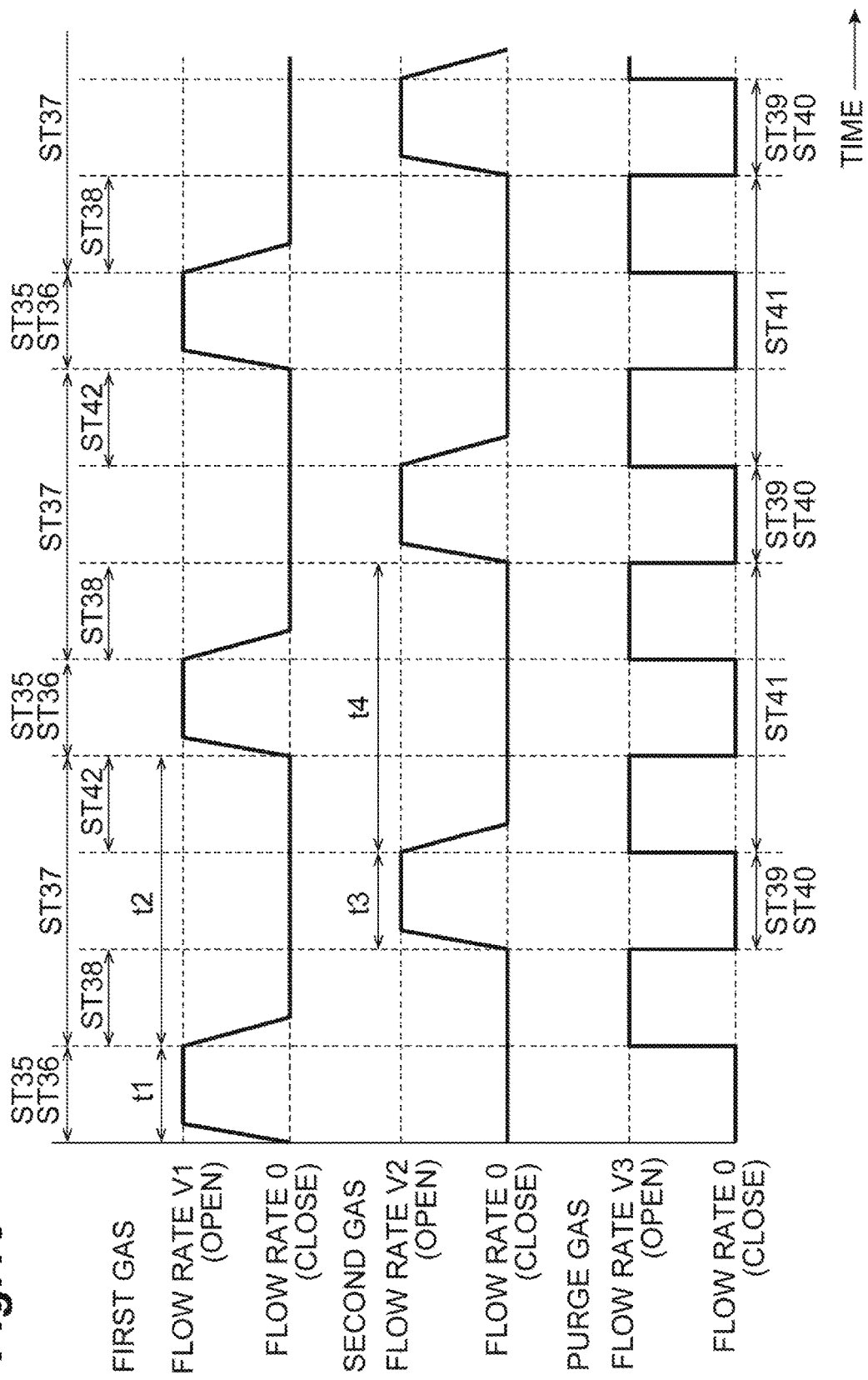

METHOD FOR INSPECTING FLOW RATE CONTROLLER AND METHOD FOR PROCESSING WORKPIECE

CROSS-REFERENCE TO RELATED APPLICATIONS

This application is based on and claims the benefit of priority from Japanese Patent Application No. 2017-068162 filed on Mar. 30, 2017, the entire contents of which are incorporated herein by reference.

FIELD

Exemplary embodiments of the present disclosure relate to a method for inspecting a flow rate controller and a method for processing a workpiece.

BACKGROUND

In the manufacture of electronic devices such as semiconductor devices, a substrate processing apparatus is used. In a chamber of the substrate processing apparatus, gas for processing a substrate is supplied from a gas supply system. The gas supply system includes a flow rate controller which adjusts the flow rate of the gas.

The flow rate of gas is controlled by a flow rate controller such as a pressure control type flow rate controller (FCS) or a mass flow rate controller, but an error may occur between a set flow rate and the flow rate (output flow rate) of the gas which is actually output from the flow rate controller in some cases. Therefore, it is necessary to inspect the output flow rate of the flow rate controller. As a method of inspecting the output flow rate of the flow rate controller, a so-called build-up method is known. The build-up method is described in Japanese Patent No. 5286430.

In the build-up method, gas is output from the flow rate controller at a constant output flow rate, and is supplied to the internal space of a tank having a known volume. Then, while the gas is supplied to the tank, a measured value of the pressure in the internal space is acquired by a pressure sensor. Then, a rise rate of the pressure in the internal space over time is obtained from the acquired measured value, and the output flow rate is obtained by using the rise rate of the pressure. As the tank used in the build-up method, a chamber body of a substrate processing apparatus may be used, or a tank dedicated to the build-up method may be used in some cases.

SUMMARY

In one aspect, a method for inspecting a flow rate controller which adjusts a flow rate of gas to be supplied to an interior of a chamber of a substrate processing apparatus is provided. The substrate processing apparatus comprises a chamber body providing the chamber, a pressure gauge configured to measure a pressure in the chamber, an exhaust device configured to depressurize the chamber, a valve provided between the chamber body and the exhaust device, and a gas supply system configured to supply gas to the chamber, the gas supply system including the flow rate controller which outputs gas at a flow rate corresponding to a designated set flow rate. The method includes a first step of performing a continuous output of gas at the flow rate corresponding to the set flow rate from the flow rate controller, in a state where a control valve of the flow rate controller is opened, after the chamber is depressurized by the exhaust device; a second step of closing the valve, in a state where the continuous output of gas is performed; a third step of obtaining a first pressure rise characteristic representing a temporal change of a pressure value in the chamber due to the continuous output of gas after the valve is closed in the second step; a fourth step of performing an intermittent output of gas from the flow rate controller by alternately repeating a first period of opening the control valve for a first time length and a second period of closing the control valve for a second time length such that gas is to be output at a flow rate corresponding to the set flow rate, the fourth step being performed after the chamber is depressurized by the exhaust device; a fifth step of closing the valve, in a state where the intermittent output of the gas is performed; a sixth step of obtaining a second pressure rise characteristic representing a temporal change of a pressure value in the chamber due to the intermittent output of the gas after the valve is closed in the fifth step; a seventh step of obtaining a third pressure rise characteristic representing a temporal change of a pressure value obtained by subtracting a temporal change of a pressure value of the chamber when the valve and the control valve are closed, from a temporal change of a pressure value specified by the first pressure rise characteristic; an eighth step of obtaining a fourth pressure rise characteristic representing a temporal change of a pressure value obtained by subtracting a temporal change of a pressure value of the chamber when the valve and the control valve are closed, from a temporal change of a pressure value specified by the second pressure rise characteristic; a ninth step of obtaining a first required time required from a start of the continuous output of gas by the flow rate controller until a predetermined pressure is reached, from a temporal change of a pressure value specified by the third pressure rise characteristic; a tenth step of obtaining a second required time required from a start of the intermittent output of the gas by the flow rate controller until the predetermined pressure is reached, from a temporal change of a pressure value specified by the fourth pressure rise characteristic; an 11th step of obtaining an estimated time from a start of the intermittent output of the gas by the flow rate controller until the predetermined pressure is reached, in a case where the intermittent output of the gas is performed in the fourth step assuming that there is no delay time for intermittent supply of gas by the flow rate controller; and a 12th step of obtaining a parameter representing a difference between the estimated time and the second required time.

In another aspect, a method for processing a workpiece by using a substrate processing apparatus is provided. The substrate processing apparatus comprises a chamber body providing a chamber, a pressure gauge configured to measure a pressure in the chamber, an exhaust device configured to depressurize the chamber, a valve provided between the chamber body and the exhaust device, and a gas supply system configured to supply gas to the chamber, the gas supply system including one or more flow rate controllers which control a flow rate of gas. The method includes a first step of performing a continuous output of first gas at a flow rate corresponding to a first set flow rate designated in recipe data from a first flow rate controller, in a state where a control valve of the first flow rate controller among the one or more flow rate controllers is opened, after the chamber is depressurized by the exhaust device; a second step of closing the valve, in a state where the continuous output of the first gas from the first flow rate controller is performed; a third step of obtaining a first pressure rise characteristic representing a temporal change of a pressure value in the chamber due to the continuous output of the first gas from the first flow rate controller after the valve is closed in the second step; a fourth step of performing an intermittent output of first gas from the first flow rate controller, by alternately repeating a first period of opening a control valve of the first flow rate controller for a first time length and a second period of closing the control valve of the first flow rate controller for a second time length such that the first gas is to be output at a flow rate according to the first set flow rate, the fourth step being performed after the chamber is depressurized by the exhaust device; a fifth step of closing the valve, in a state where the intermittent output of the first gas from the first flow rate controller is performed; a sixth step of obtaining a second pressure rise characteristic representing a temporal change of a pressure value in the chamber due to the intermittent output of the first gas from the first flow rate controller after the valve is closed in the fifth step; a seventh step of obtaining a third pressure rise characteristic representing a temporal change of a pressure value obtained by subtracting a temporal change of a pressure value of the chamber when the valve and the control valve are closed, from a temporal change of a pressure value specified by the first pressure rise characteristic; an eighth step of obtaining a fourth pressure rise characteristic representing a temporal change of a pressure value obtained by subtracting a temporal change of a pressure value of the chamber when the valve and the control valve are closed, from a temporal change of a pressure value specified by the second pressure rise characteristic; a ninth step of obtaining a first required time required from a start of the continuous output of the first gas from the first flow rate controller until a predetermined pressure is reached, from a temporal change of a pressure value specified by the third pressure rise characteristic; a tenth step of obtaining a second required time required from a start of the intermittent output of the first gas from the first flow rate controller until the predetermined pressure is reached, from a temporal change of a pressure value specified by the fourth pressure rise characteristic; an 11th step of obtaining an estimated time from a start of the intermittent output of the first gas from the first flow rate controller until the predetermined pressure is reached, in a case where the intermittent output of the first gas is performed in the fourth step assuming that there is no delay time in the intermittent output of the first gas from the first flow rate controller; a 12th step of obtaining a parameter representing a difference between the estimated time obtained in the 11th step and the second required time; a 13th step of adjusting at least one of the first time length, the second time length, and the first set flow rate, which are included in the recipe data, such that a difference between the parameter obtained in the 12th step and a reference value decreases; and a 14th step of performing the intermittent output of the first gas from the first flow rate controller and processing the workpiece in the chamber by the output first gas, by alternately repeating the first period and the second period, according to recipe data in which at least one of the first time length, the second time length, and the first set flow rate is adjusted in the 13th step.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

FIG. 8 is a flow diagram illustrating a method of processing a workpiece according to an exemplary embodiment.

FIG. 10 is a diagram illustrating a flow rate of gas output from a gas supply system.

DETAILED DESCRIPTION

Figure 1:
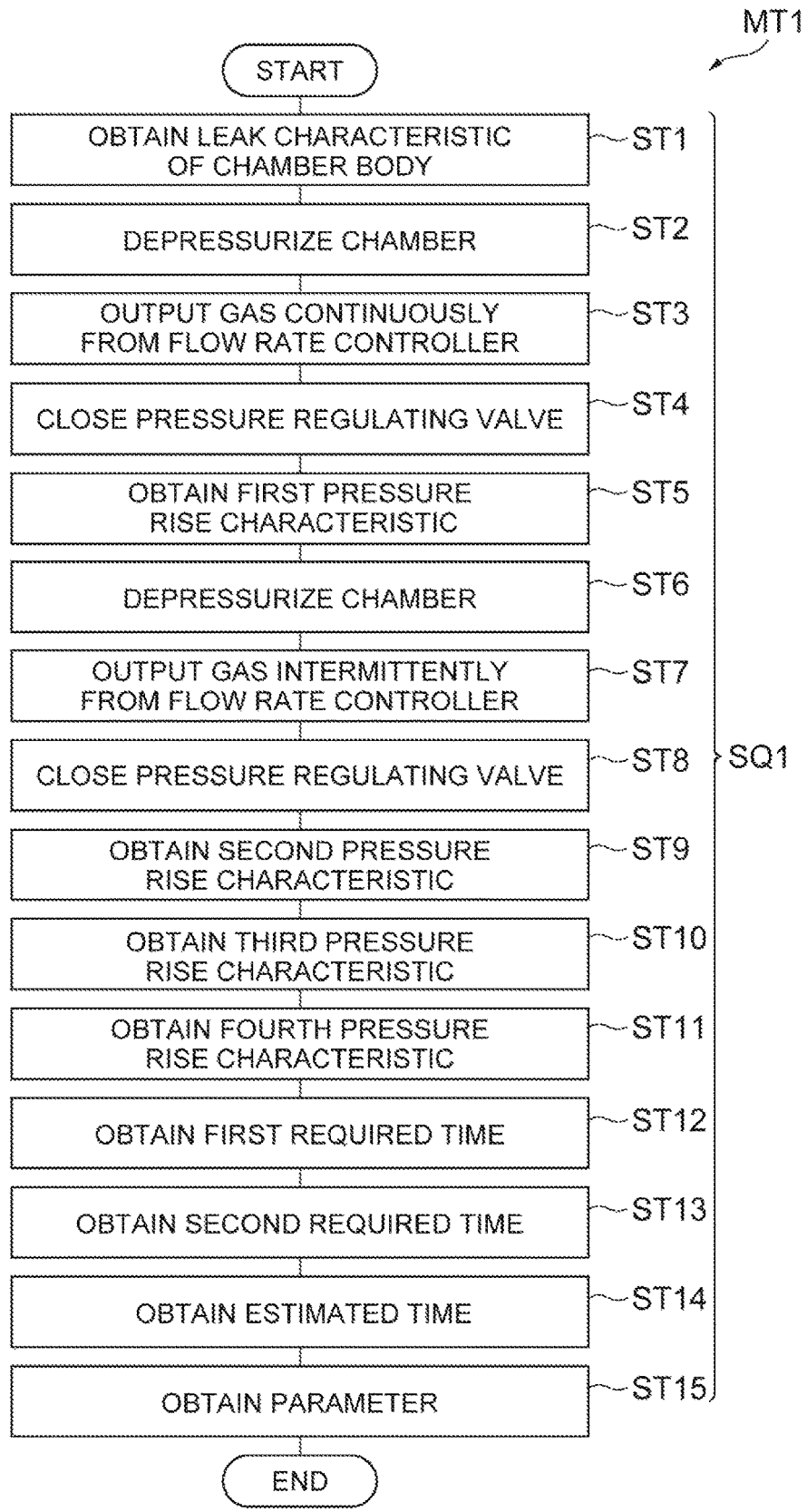
FIG. 1 is a flow diagram illustrating a method of inspecting a flow rate controller according to an exemplary embodiment.

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

In the case of processing a workpiece by using a substrate processing apparatus, the flow rate of the gas output from the gas supply system may change over time. For example, there are cases where gas is intermittently output from a flow rate controller by alternately repeating a period of outputting gas at a constant flow rate from the flow rate controller and a period of stopping the supply of gas from the flow rate controller. In a case where the gas is intermittently output from the flow rate controller, there is a delay time required for the flow rate of the gas to be stabilized at a constant flow rate from the state where the output of the gas is stopped, and a delay time required for stopping the output of the gas from the state where the gas is output at a constant flow rate. Since these delay times affect the processing of the workpiece, it is necessary to grasp these delay times.

Therefore, it is required to inspect the flow rate controller so as to be able to recognize the delay time in intermittent gas supply from the flow rate controller.

In one aspect, a method for inspecting a flow rate controller which adjusts a flow rate of gas to be supplied to an interior of a chamber of a substrate processing apparatus is provided. The substrate processing apparatus comprises a chamber body providing the chamber, a pressure gauge configured to measure a pressure in the chamber, an exhaust device configured to depressurize the chamber, a valve provided between the chamber body and the exhaust device, and a gas supply system configured to supply gas to the chamber, the gas supply system including the flow rate controller which outputs gas at a flow rate corresponding to a designated set flow rate. The method includes a first step of performing a continuous output of gas at the flow rate corresponding to the set flow rate from the flow rate controller, in a state where a control valve of the flow rate controller is opened, after the chamber is depressurized by the exhaust device; a second step of closing the valve, in a state where the continuous output of gas is performed; a third step of obtaining a first pressure rise characteristic representing a temporal change of a pressure value in the chamber due to the continuous output of gas after the valve is closed in the second step; a fourth step of performing an intermittent output of gas from the flow rate controller by alternately repeating a first period of opening the control valve for a first time length and a second period of closing the control valve for a second time length such that gas is to be output at a flow rate corresponding to the set flow rate, the fourth step being performed after the chamber is depressurized by the exhaust device; a fifth step of closing the valve, in a state where the intermittent output of the gas is performed; a sixth step of obtaining a second pressure rise characteristic representing a temporal change of a pressure value in the chamber due to the intermittent output of the gas after the valve is closed in the fifth step; a seventh step of obtaining a third pressure rise characteristic representing a temporal change of a pressure value obtained by subtracting a temporal change of a pressure value of the chamber when the valve and the control valve are closed, from a temporal change of a pressure value specified by the first pressure rise characteristic; an eighth step of obtaining a fourth pressure rise characteristic representing a temporal change of a pressure value obtained by subtracting a temporal change of a pressure value of the chamber when the valve and the control valve are closed, from a temporal change of a pressure value specified by the second pressure rise characteristic; a ninth step of obtaining a first required time required from a start of the continuous output of gas by the flow rate controller until a predetermined pressure is reached, from a temporal change of a pressure value specified by the third pressure rise characteristic; a tenth step of obtaining a second required time required from a start of the intermittent output of the gas by the flow rate controller until the predetermined pressure is reached, from a temporal change of a pressure value specified by the fourth pressure rise characteristic; an 11th step of obtaining an estimated time from a start of the intermittent output of the gas by the flow rate controller until the predetermined pressure is reached, in a case where the intermittent output of the gas is performed in the fourth step assuming that there is no delay time for intermittent supply of gas by the flow rate controller; and a 12th step of obtaining a parameter representing a difference between the estimated time and the second required time.

In the method according to the above aspect, the estimated time is a time required until the pressure in the chamber reaches a predetermined pressure when the gas is intermittently output from the flow rate controller, assuming that there is no delay time. On the other hand, the second required time is the time required until the pressure in the chamber reaches a predetermined pressure when the gas is intermittently output from the flow rate controller, in the actual situation where the delay time is present. Therefore, the parameter representing the difference between the estimated time and the second required time is a parameter depending on the delay time. Therefore, in the method according to an aspect, it is possible to recognize the delay time of the flow rate controller by obtaining the above parameters.

In an exemplary embodiment, when assuming the estimated time as $T3$, the estimated time $T3$ may be obtained by Equation (1).

$$T3 = T1 \cdot (t1 + t2)/t1 \quad (1)$$

wherein $T1$ is the first required time, $t1$ is the first time length, and $t2$ is the second time length in Equation (1).

In an exemplary embodiment, a 13th step of outputting an alarm when a difference between the parameter obtained in the 12th step and a reference value is greater than a predetermined threshold value may be further included.

In a case where the difference between the obtained parameter value and the reference value is large, it is predicted that the delay time is large and the error between the amount of gas to be supplied to the chamber and the amount of gas actually supplied to the chamber is large. According to the method according to the above exemplary embodiment, since an alarm is output when the difference between the obtained parameter and the reference value is larger than the predetermined threshold value, it is possible to recognize that such an error occurs.

In another aspect, a method for processing a workpiece by using a substrate processing apparatus is provided. The substrate processing apparatus comprises a chamber body providing a chamber, a pressure gauge configured to measure a pressure in the chamber, an exhaust device configured to depressurize the chamber, a valve provided between the chamber body and the exhaust device, and a gas supply system configured to supply gas to the chamber, the gas supply system including one or more flow rate controllers which control a flow rate of gas. The method includes a first step of performing a continuous output of first gas at a flow rate corresponding to a first set flow rate designated in recipe data from a first flow rate controller, in a state where a control valve of the first flow rate controller among the one or more flow rate controllers is opened, after the chamber is depressurized by the exhaust device; a second step of closing the valve, in a state where the continuous output of the first gas from the first flow rate controller is performed; a third step of obtaining a first pressure rise characteristic representing a temporal change of a pressure value in the chamber due to the continuous output of the first gas from the first flow rate controller after the valve is closed in the second step; a fourth step of performing an intermittent output of first gas from the first flow rate controller, by alternately repeating a first period of opening a control valve of the first flow rate controller for a first time length and a second period of closing the control valve of the first flow rate controller for a second time length such that the first gas is to be output at a flow rate according to the first set flow rate, the fourth step being performed after the chamber is depressurized by the exhaust device; a fifth step of closing the valve, in a state where the intermittent output of the first gas from the first flow rate controller is performed; a sixth step of obtaining a second pressure rise characteristic representing a temporal change of a pressure value in the chamber due to the intermittent output of the first gas from the first flow rate controller after the valve is closed in the fifth step; a seventh step of obtaining a third pressure rise characteristic representing a temporal change of a pressure value obtained by subtracting a temporal change of a pressure value of the chamber when the valve and the control valve are closed, from a temporal change of a pressure value specified by the first pressure rise characteristic; an eighth step of obtaining a fourth pressure rise characteristic representing a temporal change of a pressure value obtained by subtracting a temporal change of a pressure value of the chamber when the valve and the control valve are closed, from a temporal change of a pressure value specified by the second pressure rise characteristic; a ninth step of obtaining a first required time required from a start of the continuous output of the first gas from the first flow rate controller until a predetermined pressure is reached, from a temporal change of a pressure value specified by the third pressure rise characteristic; a tenth step of obtaining a second required time required from a start of the intermittent output of the first gas from the first flow rate controller until the predetermined pressure is reached, from a temporal change of a pressure value specified by the fourth pressure rise characteristic; an 11th step of obtaining an estimated time from a start of the intermittent output of the first gas from the first flow rate controller until the predetermined pressure is reached, in a case where the intermittent output of the first gas is performed in the fourth step assuming that there is no delay time in the intermittent output of the first gas from the first flow rate controller; a 12th step of obtaining a parameter representing a difference between the estimated time obtained in the 11th step and the second required time; a 13th step of adjusting at least one of the first time length, the second time length, and the first set flow rate, which are included in the recipe data, such that a difference between the parameter obtained in the 12th step and a reference value decreases; and a 14th step of performing the intermittent output of the first gas from the first flow rate controller and processing the workpiece in the chamber by the output first gas, by alternately repeating the first period and the second period, according to recipe data in which at least one of the first time length, the second time length, and the first set flow rate is adjusted in the 13th step.

In the method according to the above aspect, at least one of the first time length, the second time length, and the first set flow rate is adjusted so that the difference between the obtained parameter value and the reference value decreases. By intermittently supplying the first gas to the chamber according to the recipe data which is thus adjusted, the error between the amount of gas to be supplied to the chamber and the amount of gas actually supplied to the chamber can be reduced. By reducing such an error, it is possible to improve the processing accuracy of the workpiece.

The method according to one exemplary embodiment may further include a 15th step of performing a continuous output of second gas at a flow rate corresponding to a second set flow rate designated in the recipe data from a second flow rate controller, in a state where a control valve of the second flow rate controller among the one or more flow rate controllers is opened, after the chamber is depressurized by the exhaust device; a 16th step of closing the valve, in a state where the continuous output of the second gas from the second flow rate controller is performed; a 17th step of obtaining a fifth pressure rise characteristic representing a temporal change of a pressure value in the chamber due to the continuous output of the second gas from the second flow rate controller after the valve is closed in the 16th step; an 18th step of performing the intermittent output of the second gas from the second flow rate controller, by alternately repeating a third period of opening a control valve of the second flow rate controller for a third time length and a fourth period of closing the control valve of the second flow rate controller for a fourth time length such that the second gas is to be output at a flow rate according to the second set flow rate, the 18th step being performed after the chamber is depressurized by the exhaust device; a 19th step of closing the valve, in a state where the intermittent output of the second gas from the second flow rate controller is performed, a 20th step of obtaining a sixth pressure rise characteristic representing a temporal change of a pressure value in the chamber due to the intermittent output of the second gas from the second flow rate controller after the valve is closed in the 19th step; a 21th step of obtaining a seventh pressure rise characteristic representing a temporal change of a pressure value obtained by subtracting a temporal change of a pressure value of the chamber when the valve and the control valve are closed, from a temporal change of a pressure value specified by the fifth pressure rise characteristic; a 22nd step of obtaining an eighth pressure rise characteristic representing a temporal change of a pressure value obtained by subtracting a temporal change of a pressure value of the chamber when the valve and the control valve are closed, from a temporal change of a pressure value specified by the sixth pressure rise characteristic; a 23rd step of obtaining a fourth required time required from a start of the continuous output of the second gas from the second flow rate controller until a predetermined pressure is reached, from a temporal change of a pressure value specified by the seventh pressure rise characteristic; a 24th step of obtaining a fifth required time required from a start of the intermittent output of the first gas from the first flow rate controller until the predetermined pressure is reached, from a temporal change of a pressure value specified by the eighth output pressure rise characteristic; a 25th step of obtaining an estimated time from a start of the intermittent output of the second gas from the second flow rate controller until the predetermined pressure is reached, in a case where the intermittent output of the second gas is performed in the 18th step assuming that there is no delay time in the intermittent output of the second gas from the second flow rate controller; a 26th step of obtaining a parameter representing a difference between the estimated time obtained in the 25th step and the fifth required time; a 27th step of adjusting at least one of the third time length, the fourth time length, and the second set flow rate, which are included in the recipe data, such that a difference between the parameter obtained in the 26th step and the reference value decreases; and a 28th step of performing the intermittent output of the second gas from the second flow rate controller and processing the workpiece in the chamber by the output second gas, by alternately repeating the third period and the fourth period, according to the recipe data in which at least one of the third time length, the fourth time length, and the second set flow rate is adjusted in the 27th step, the first step to the 13th step may be executed before the 14th step, the 15th step to the 27th step may be executed before the 28th step, and the 14th step and the 28th step may executed alternately and repeatedly.

According to one aspect and various exemplary embodiments of the present invention, it is possible to inspect the flow rate controller so as to be able to recognize the delay time in intermittent gas supply from the flow rate controller.

Hereinafter, various exemplary embodiments will be described in detail with reference to the accompanying drawings. In the drawings, the same or corresponding parts are denoted by the same reference numerals, and duplicate descriptions for the same or corresponding parts are omitted. Further, the dimensional ratio of each drawing does not always match the actual dimensional ratio.

FIG. 1 is a flow diagram illustrating a method of inspecting a flow rate controller according to an exemplary embodiment. A method MT1 illustrated in FIG. 1 can be applied to any substrate processing apparatus.

Figure 2:
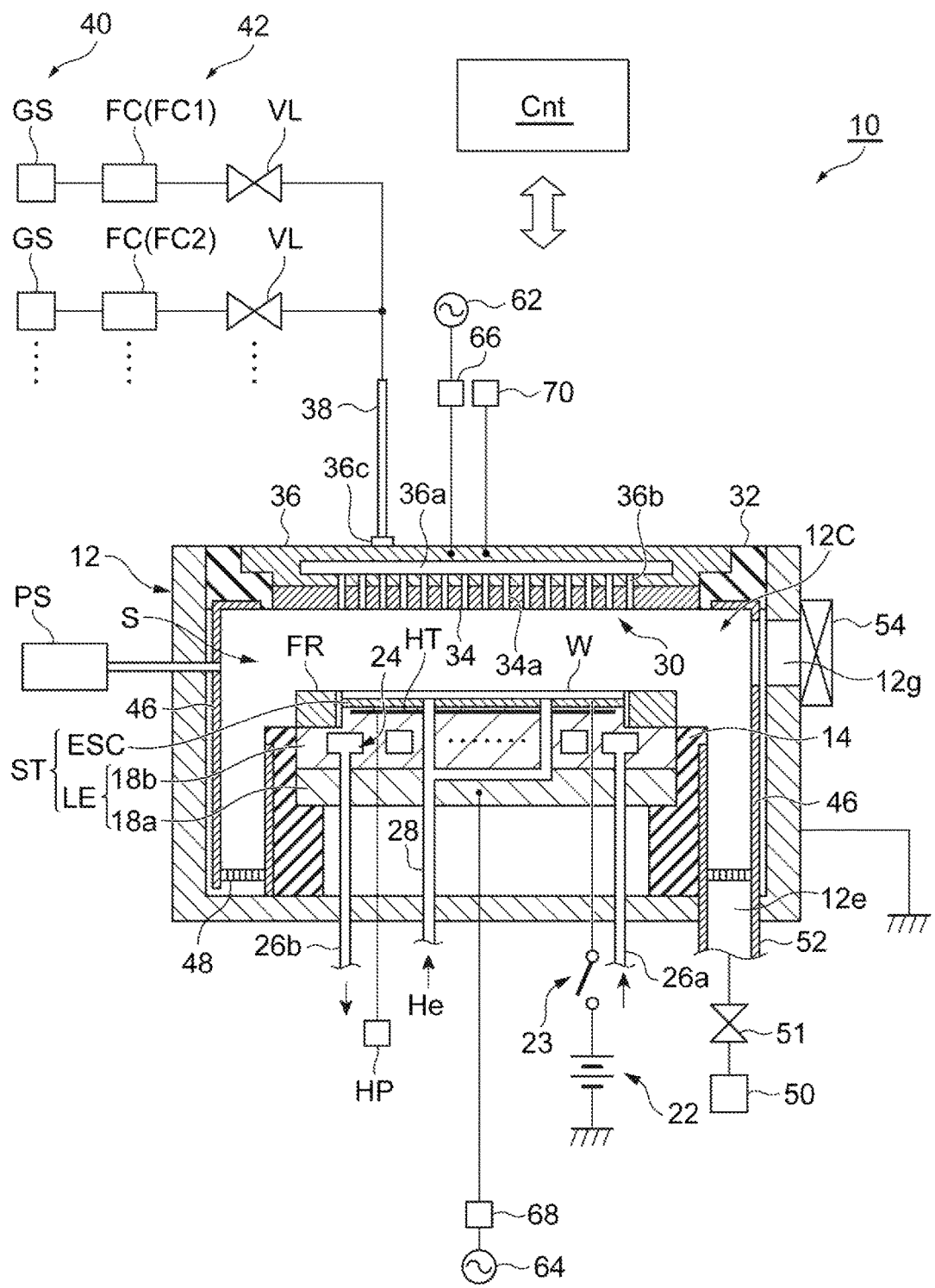
FIG. 2 is a vertical cross-sectional view schematically illustrating a substrate processing apparatus according to an exemplary embodiment.

FIG. 2 is a view illustrating a plasma processing apparatus which is an example of a substrate processing apparatus for which the method MT1 is provided. FIG. 2 schematically illustrates a cross-sectional structure of a plasma processing apparatus 10 that can be used in various exemplary embodiments of a method of processing a workpiece. As illustrated in FIG. 2, the plasma processing apparatus 10 is a plasma etching apparatus having electrodes of parallel flat plates, and includes a chamber body 12. The chamber body 12 has a substantially cylindrical shape, and its internal space is provided as a chamber 12c. The chamber body 12 is made of, for example, aluminum, and its inner wall surface is subjected to anodic oxidation treatment. The chamber body 12 is securely grounded. The plasma processing apparatus 10 is provided with a pressure gauge PS for measuring the pressure value in the chamber 12c.

A substantially cylindrical support portion 14 is provided on the bottom portion of the chamber body 12. The support portion 14 can be made of an insulating material such as quartz, for example. The support portion 14 extends in the vertical direction from the bottom portion of the chamber body 12, in the chamber body 12. In the chamber 12c, a stage ST is provided. The stage ST is supported by the support portion 14.

The stage ST supports a workpiece (hereinafter referred to as "wafer W") on the upper surface. The stage ST has a lower electrode LE and an electrostatic chuck ESC. The lower electrode LE includes a first plate 18a and a second plate 18b. The first plate 18a and the second plate 18b are made of metal such as aluminum, for example, and have a substantially disc shape. The second plate 18b is provided on the first plate 18a and is electrically connected to the first plate 18a.

On the second plate 18b, an electrostatic chuck ESC is provided. The electrostatic chuck ESC has a structure in which an electrode which is a conductive film is disposed between a pair of insulating layers or between a pair of insulating sheets. A DC power supply 22 is electrically connected to the electrode of the electrostatic chuck ESC through a switch 23. The electrostatic chuck ESC attracts the wafer W by an electrostatic force such as a Coulomb force generated by a DC voltage from the DC power supply 22. Thus, the electrostatic chuck ESC can hold the wafer W.

On the peripheral portion of the second plate 18b, a focus ring FR is disposed to surround the edge of the wafer W and the electrostatic chuck ESC. The focus ring FR is provided to improve etching uniformity. The focus ring FR is made of a material appropriately selected depending on the material of the film to be etched, and can be made of, for example, quartz.

Inside the second plate 18b, a coolant flow path 24 is provided. The coolant flow path 24 constitutes a temperature control mechanism. Coolant is supplied to the coolant flow path 24 from a chiller unit (not illustrated) provided outside the chamber body 12 through a pipe 26a. The coolant supplied to the coolant flow path 24 is returned to the chiller unit through the pipe 26b. In this manner, the coolant is supplied to the coolant flow path 24 so as to circulate. By controlling the temperature of the coolant, the temperature of the wafer W supported by the electrostatic chuck ESC is controlled.

The plasma processing apparatus 10 is provided with a gas supply line 28. The gas supply line 28 supplies heat transfer gas, for example He gas, from the heat transfer gas supply mechanism to between the upper surface of the electrostatic chuck ESC and the back surface of the wafer W.

In the plasma processing apparatus 10, a heater HT as a heating element is provided. For example, the heater HT is embedded in the second plate 18b. A heater power supply HP is connected to the heater HT. By supplying power from the heater power supply HP to the heater HT, the temperature of the stage ST is adjusted, and the temperature of the wafer W placed on the stage ST is adjusted. The heater HT may be incorporated in the electrostatic chuck ESC.

The plasma processing apparatus 10 includes an upper electrode 30. The upper electrode 30 is disposed to face the stage ST, above the stage ST. The lower electrode LE and the upper electrode 30 are provided in substantially parallel to each other. Between the upper electrode 30 and the lower electrode LE, a processing space S for performing plasma processing on the wafer W is provided.

The upper electrode 30 is supported on the upper part of the chamber body 12 through an insulating shielding member 32. The insulating shielding member 32 is made of an insulating material such as quartz. The upper electrode 30 may include an electrode plate 34 and an electrode support 36. The electrode plate 34 faces the processing space S, and the electrode plate 34 is provided with a plurality of gas discharge holes 34a. The electrode plate 34 contains silicon in an exemplary embodiment. In another exemplary embodiment, the electrode plate 34 may contain silicon oxide.

The electrode support 36 detachably supports the electrode plate 34, and can be made of a conductive material such as aluminum, for example. The electrode support 36 may have a water cooling structure. Inside the electrode support 36, a gas diffusion chamber 36a is provided. A plurality of gas flow holes 36b communicating with the gas discharge holes 34a extend downward from the gas diffusion chamber 36a. A gas inlet 36c for guiding the processing gas to the gas diffusion chamber 36a is formed in the electrode support 36, and a gas supply pipe 38 is connected to the gas inlet 36c.

To the gas supply pipe 38, a gas source group 40 and a gas supply system 42 are connected. The gas source group 40 has a plurality of gas sources GS. The plurality of gas sources GS is a gas source of an organic-containing aminosilane-based gas, a gas source of a fluorocarbon-based gas ($C_xF_y$ gas (x and y are integers of 1 to 10)), a gas source of a gas having oxygen atoms and carbon atoms (for example, carbon dioxide gas, or the like), a gas source of nitrogen gas, a gas source of hydrogen containing gas, and a gas source of rare gas. As the fluorocarbon gas, any fluorocarbon gas such as $CF_4$ gas, $C_4F_6$ gas, and $C_4F_8$ gas is used. As the rare gas, any rare gas such as Ar gas and He gas is used.

The gas supply system 42 includes a plurality of flow rate controllers FC. The plurality of flow rate controllers FC are, for example, a mass flow rate controller or a pressure control type flow rate controller. The plurality of flow rate controllers FC is connected to the plurality of gas sources GS of the gas source group 40, respectively. Each of the plurality of flow rate controllers FC has a control valve, and outputs the gas from the corresponding gas source GS at an individually adjusted flow rate by controlling the control valve. In an exemplary embodiment, the plurality of flow rate controllers FC includes a first flow rate controller FC1 and a second flow rate controller FC2.

Figure 3:
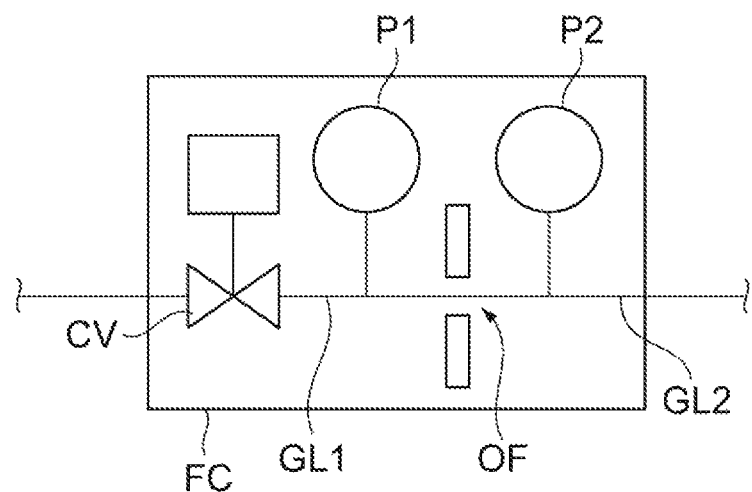
FIG. 3 is a diagram schematically illustrating an example of a flow rate controller.

FIG. 3 illustrates an example of one flow rate controller FC1 among a plurality of flow rate controllers FC. The flow rate controller FC1 illustrated in FIG. 2 is a pressure control type flow rate controller, and includes a control valve CV, an orifice OF, a pressure gauge P1 and a pressure gauge P2. Further, the flow rate controller FC1 provides a gas line GL1 on the upstream side of the orifice OF and a gas line GL2 on the downstream side of the orifice OF. The gas line GL1 and the gas line GL2 are respectively connected to the gas supply pipe 38. The flow rate controller FC1 calculates the flow rate of the gas output from the flow rate controller FC1, based on the pressure value measured by at least one of the pressure gauge P1 and the pressure gauge P2. Then, the control valve CV is controlled so that the difference between the calculated flow rate and the designated set flow rate decreases.

As illustrated in FIG. 2, the gas supply system 42 may further include a plurality of valves VL. The plurality of valves VL are provided downstream of the plurality of flow rate controllers FC, respectively.

In the plasma processing apparatus 10, a deposit shield 46 is detachably provided along the inner wall of the chamber body 12. The deposit shield 46 is also provided on the outer periphery of the support portion 14. The deposit shield 46 prevents etching by-products (deposits) from adhering to the chamber body 12, and can be made by coating an aluminum material with ceramics such as $Y_2O_3$. In addition to $Y_2O_3$, the depot shield can be made of a material containing oxygen such as quartz, for example.

A baffle plate 48 is provided on the bottom side of the chamber body 12 and between the support portion 14 and the side wall of the chamber body 12. The baffle plate 48 can be made, for example, by covering an aluminum material with ceramics such as $Y_2O_3$. An exhaust port 12e is provided below the baffle plate 48. The exhaust port 12e is provided with an exhaust pipe 52. An exhaust device 50 is connected to the exhaust pipe 52 through a pressure regulating valve 51. That is, the pressure regulating valve 51 is a valve provided between the chamber body 12 and the exhaust device 50. The exhaust device 50 includes a vacuum pump such as a turbo molecular pump, and can depressurize the space inside the chamber body 12 to a degree of vacuum corresponding to the degree of opening of the pressure regulating valve 51. A loading/unloading port 12g of the wafer W is provided on a side wall of the chamber body 12, and the loading/unloading port 12g can be opened and closed by a gate valve 54.

The plasma processing apparatus 10 further includes a first high-frequency power supply 62 and a second high-frequency power supply 64. The first high-frequency power supply 62 is a power supply for generating a first high-frequency power for plasma generation, and generates high-frequency power of a frequency of 27 to 100 [MHz], for example, 60 [MHz] in an example. The first high-frequency power supply 62 is connected to the upper electrode 30 through a matching unit 66. The matching unit 66 is a circuit that matches the output impedance of the first high-frequency power supply 62 and the input impedance on the load side (lower electrode LE side). The first high-frequency power supply 62 may be connected to the lower electrode LE through the matching unit 66.

The second high-frequency power supply 64 is a power supply that generates second high-frequency power for attracting ions to the wafer W, that is, a high-frequency bias power, and generates a frequency within the range of 400 [kHz] to 13.56 [MHz], in one example, a high-frequency bias power with a frequency of 13.56 [MHz]. The second high-frequency power supply 64 is connected to the lower electrode LE through a matching unit 68. The matching unit 68 is a circuit that matches the output impedance of the second high-frequency power supply 64 and the input impedance on the load side (lower electrode LE side).

The plasma processing apparatus 10 further includes a power supply 70. The power supply 70 is connected to the upper electrode 30. The power supply 70 applies to the upper electrode 30, a voltage for attracting positive ions present in the processing space S to the electrode plate 34. In one example, the power supply 70 is a DC power supply that generates a negative DC voltage. When such a voltage is applied from the power supply 70 to the upper electrode 30, the positive ions present in the processing space S collide with the electrode plate 34. Thus, secondary electrons and/or silicon is emitted from the electrode plate 34.

In an exemplary embodiment, the plasma processing apparatus 10 may further include a control unit Cnt. The control unit Cnt is a computer including a processor, a storage unit, an input device, a display device, and the like, and controls each unit of the plasma processing apparatus 10. Specifically, the control unit Cnt is connected to the gas supply system 42, the exhaust device 50, the first high-frequency power supply 62, the matching unit 66, the second high-frequency power supply 64, the matching unit 68, the power supply 70, heater power supply HP, and the chiller unit.

The control unit Cnt operates according to a program based on the input recipe and sends out a control signal. It is possible to control the flow rate of the gas output from each flow rate controller FC of the gas supply system 42, the exhaust by the exhaust device 50, the power supply from the first high-frequency power supply 62 and the second high-frequency power supply 64, the voltage application from the power supply 70, the power supply from the heater power supply HP, the coolant flow rate and coolant temperature from the chiller unit, according to the control signal from the control unit Cnt. Each step of the method MT1 illustrated in FIG. 1 can be executed by operating each unit of the plasma processing apparatus 10 under the control by the control unit Cnt.

The method MT1 will be described with reference to FIG. 1 again. In the method MT1, among the plurality of flow rate controllers FC, the flow rate controller FC1 is inspected. That is, in the method MT1, the flow rate controller FC1 is the flow rate controller to be inspected. In the method MT1, a sequence SQ1 is executed. The sequence SQ1 includes step ST1 to step ST15 to be described later. In the sequence SQ1, step ST1 is executed first.

Figure 4:
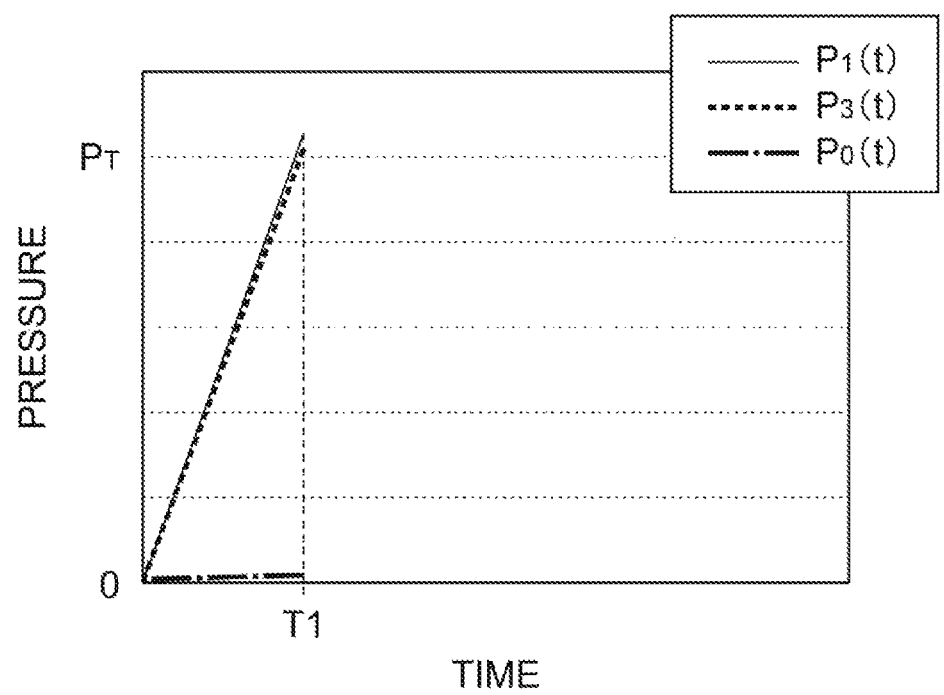
FIG. 4 is a graph illustrating a temporal change of a pressure value in a chamber.
Figure 5:
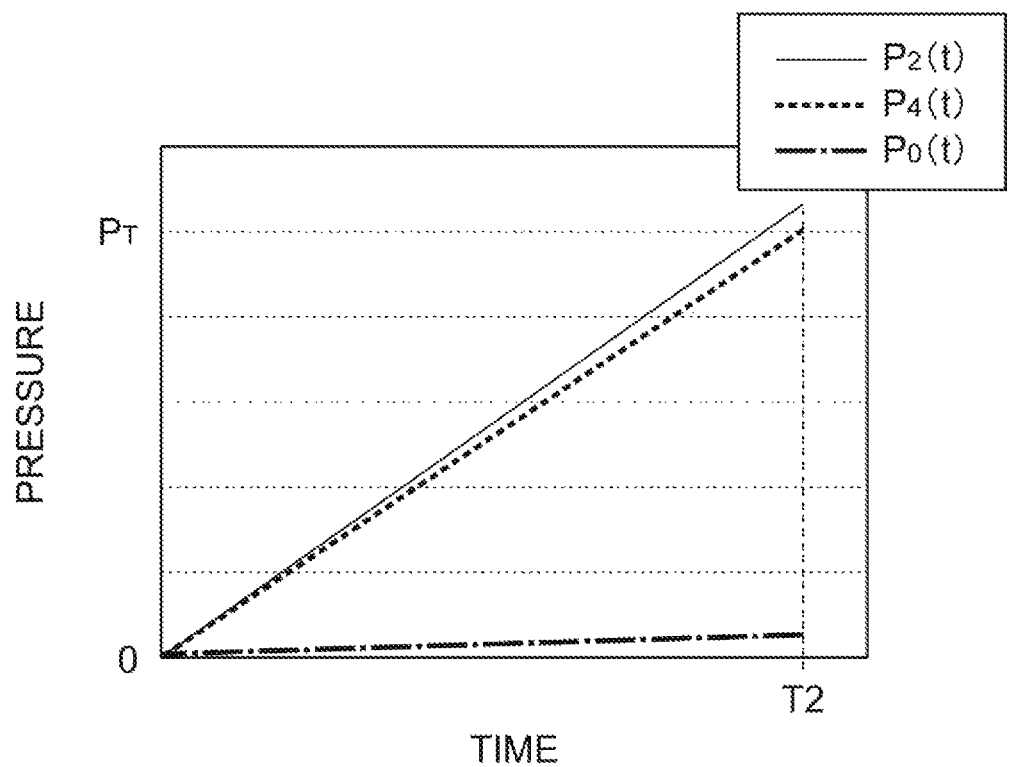
FIG. 5 is a graph illustrating a temporal change of a pressure value in a chamber.

In step ST1, the leak characteristic of the chamber body 12 is obtained. The leak characteristic of the chamber body 12 indicates a pressure rise characteristic representing a temporal change of the pressure value in the chamber 12c when the pressure regulating valve 51 and the control valve CV of the flow rate controller FC are closed. In step ST1, first, the pressure regulating valve 51 is opened, and the exhaust device 50 is operated. As a result, the interior of the chamber 12c is depressurized. Next, the control valves CV and the pressure regulating valve 51 of each of the plurality of flow rate controllers are closed, and the pressure value in the chamber 12c at one or more subsequent time points is measured by the pressure gauge PS. Then, a temporal change $P_0(t)$ is acquired as a leak characteristic from the pressure value in the chamber 12c at one or more measured time points. The graphs illustrated by the dashed lines in FIGS. 4 and 5 illustrate an example of the temporal change $P_0(t)$ of the pressure value in the chamber 12c specified by the leak characteristic of the chamber body 12 in an exemplary embodiment. The temporal change $P_0(t)$ of the pressure value is defined as, for example, a straight line approximating a relationship between the plurality of measured pressure values and the time points when the plurality of measured pressure values are acquired. Further, the temporal change $P_0(t)$ of the pressure value can also be defined as a straight line connecting the pressure value measured at a certain time point and the origin of the graphs illustrated in FIGS. 4 and 5.

In the subsequent step ST2, the pressure regulating valve 51 is opened and the exhaust device 50 is operated. As a result, the interior of the chamber 12c is depressurized. In the subsequent step ST3, the valve VL located downstream of the flow rate controller FC1 is opened and the control valve of the flow rate controller FC1 is opened. Thus, gas is continuously output from the flow rate controller FC1 at a flow rate corresponding to the set flow rate. The set flow rate is, for example, a flow rate determined according to the recipe data stored in the storage unit of the control unit Cnt. In step ST3, a constant flow rate, for example, 20 sccm of gas is continuously output from the flow rate controller FC1 to the chamber 12c.

In the subsequent step ST4, the pressure regulating valve 51 is closed in a state where gas is continuously output from the flow rate controller FC1 in step ST3. Next, in step ST5, the pressure value in the chamber 12c at one or more time points after the pressure regulating valve 51 is closed is measured. The pressure value in the chamber 12c is measured, for example, using a pressure gauge PS. In an exemplary embodiment, the pressure gauge PS can measure the pressure value in the chamber 12c at a plurality of time points within a period from the time when the pressure regulating valve 51 is closed to the time when the pressure value in the chamber 12c reaches the predetermined pressure value. Based on the measured pressure value, a temporal change $P_1(t)$ of the pressure value in the chamber 12c after the pressure regulating valve 51 is closed is acquired as a first pressure rise characteristic. The graph illustrated by the solid line in FIG. 4 illustrates an example of the temporal change $P_1(t)$ of the pressure value in the chamber 12c when the gas of a constant flow rate is continuously output from the flow rate controller FC1 to the chamber 12c. The temporal change $P_1(t)$ of the pressure value can be defined as a straight line approximating the relationship between the plurality of pressure values measured in step ST5 and the time points when the plurality of pressure values are acquired.

In the subsequent step ST6, the pressure regulating valve 51 is opened and the exhaust device 50 is operated. As a result, the interior of the chamber 12c is depressurized. In the subsequent step ST7, the control valve is controlled so that the gas is intermittently output from the flow rate controller FC1. Specifically, the period PR1 (the first period or the third period) during which the control valve of the flow rate controller FC1 is opened over the first time length t1 and the period PR2 (the second period or the fourth period) during which the control valve of the flow rate controller FC1 is closed over the second time length t2 are alternately repeated such that gas at a flow rate corresponding to the set flow rate is to be output. That is, the flow rate controller FC1 is controlled so as to repeat a plurality of times the cycle including a period PR1 during which the gas of the set flow rate is continuously supplied from the flow rate controller FC1 over the first time length t1 and a period PR2 during which the supply of the gas from the flow rate controller FC1 is stopped over the second time length t2. Thus, gas having a flow rate corresponding to the set flow rate is intermittently output from the flow rate controller FC1.

Figure 6:
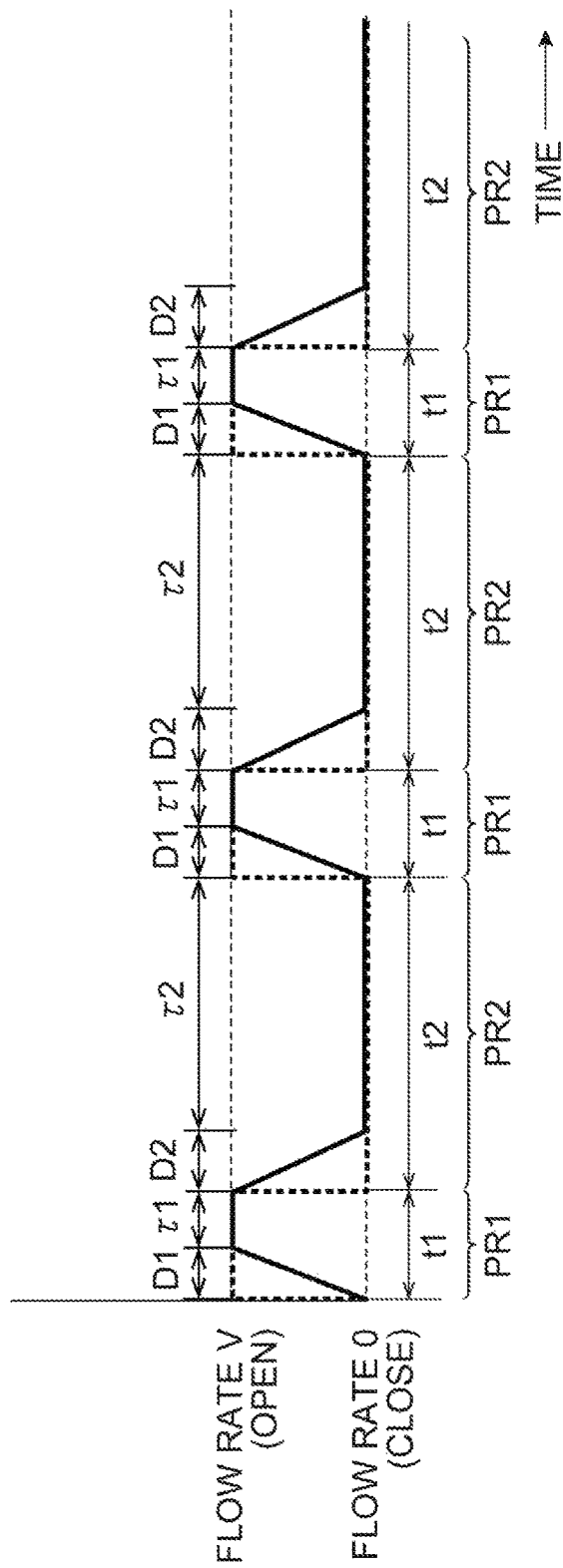
FIG. 6 is a diagram illustrating a flow rate of gas output from the flow rate controller.

FIG. 6 illustrates an example of a temporal change of the flow rate of the gas output from the flow rate controller FC1 in step ST7. As described above, in step ST7, the period PR1 during which the control valve CV of the flow rate controller FC1 is opened over the first time length t1 and the period PR2 during which the control valve CV of the flow rate controller FC1 is closed over the second time length t2 are alternately repeated. However, a delay time D1 occurs from the time point when the control valve CV is opened and the output of the gas of the flow rate controller FC1 is started until the output flow rate of the flow rate controller FC1 reaches the set flow rate V. A delay time D2 occurs from the time when the gas of the set flow rate V is output from the flow rate controller FC1 until the control valve CV is closed and the output of the gas of the flow rate controller FC1 is stopped. The delay times D1 and D2 are caused by the passage time of the gas inside the flow rate controller FC1, the delay of the control valve, and the like. With there are delay times D1 and D2, the waveform of the gas output from the flow rate controller FC1 does not become a perfect square wave as indicated by the solid line in FIG. 6. As a result, the time length T1 during which the gas is actually output from the flow rate controller FC1 at the set flow rate V is shorter than the first time length t1 during which the control valve CV is opened. The time length τ2 during which the gas from the flow rate controller FC1 is actually stopped is shorter than the second time length t2 during which the control valve CV is closed. When the difference of the time length τ1 from the first time length t1 or the difference of the time length τ2 from the second time length t2 becomes large, the processing of the workpiece is affected.

FIG. 1 is referred to again. In the subsequent step ST8, the pressure regulating valve 51 is closed in a state where gas is intermittently output from the flow rate controller FC1 in step ST7. In the subsequent step ST9, the pressure value in the chamber 12c at one or more time points after the pressure regulating valve 51 is closed in the step ST8 is measured. The pressure value in the chamber 12c is measured, for example, using a pressure gauge PS. In an exemplary embodiment, the pressure gauge PS can measure the pressure value in the chamber 12c at a plurality of time points within a period from the time when the pressure regulating valve 51 is closed in the step ST8 to the time when the pressure value in the chamber 12c reaches the predetermined pressure value. Based on the measured pressure value, a temporal change $P_2(t)$ of the pressure value in the chamber 12c after the pressure regulating valve 51 is closed is acquired as a second pressure rise characteristic. The graph illustrated by the solid line in FIG. 5 illustrates an example of the temporal change $P_2(t)$ of the pressure value in the chamber 12c when the gas is intermittently output from the flow rate controller FC1 to the chamber 12c in step ST7. The temporal change $P_2(t)$ of the pressure value can be defined as a straight line approximating the relationship between the plurality of pressure values measured in step ST9 and the time points when the plurality of pressure values are acquired.

In the subsequent step ST10, the temporal change $P_0(t)$ of a pressure value specified by the leak characteristic obtained in step ST1 is subtracted from the temporal change $P_1(t)$ of a pressure value specified by the first pressure rise characteristic obtained in step ST5, and a temporal change $P_3(t)$ of a pressure value obtained by the subtraction is obtained as a third pressure rise characteristic. That is, the temporal change $P_3(t)$ of the pressure value is obtained by calculating $P_1(t)-P_0(t)$. The graph indicated by the broken line in FIG. 4 illustrates an example of the temporal change $P_3(t)$ of the pressure value specified by the third pressure rise characteristic.

In the subsequent step ST11, the temporal change $P_0(t)$ of a pressure value specified by the leak characteristic obtained in step ST1 is subtracted from the temporal change $P_2(t)$ of a pressure value specified by the second pressure rise characteristic obtained in step ST9, and a temporal change $P_4(t)$ of a pressure value obtained by the subtraction is obtained as a fourth pressure rise characteristic. That is, the temporal change $P_4(t)$ of the pressure value is obtained by calculating $P_2(t)-P_0(t)$. The graph indicated by the broken line in FIG. 5 illustrates an example of the temporal change $P_4(t)$ of the pressure value specified by the fourth pressure rise characteristic.

In the subsequent step ST12, a first required time T1 required from the start of supply of the gas until the predetermined pressure $P_T$ is reached is obtained from the temporal change $P_3(t)$ of the pressure value. That is, the first required time T1 is a time length taken until the pressure of the chamber reaches the predetermined pressure $P_T$ when the gas is continuously supplied from the flow rate controller FC1 to the chamber 12c in step ST3. The pressure $P_T$ can be any pressure determined by the designer. In the subsequent step ST13, a second required time T2 required from the start of supply of the gas until the predetermined pressure $P_T$ is reached is obtained from the temporal change $P_4(t)$ of the pressure value. That is, the second required time T2 is a time length taken until the pressure of the chamber reaches the predetermined pressure $P_T$ when the gas is intermittently supplied from the flow rate controller FC1 to the chamber 12c in step ST7.

In the subsequent step ST14, assuming that there are no delay times D1 and D2, when gas is intermittently output from the flow rate controller FC1 under the same conditions as in the step ST7, the estimated time T3 required from a start of the intermittent supply of gas until a predetermined pressure $P_T$ is reached. That is, as illustrated by the broken line in FIG. 6, the estimated time T3 is an estimated time length required until the pressure in the chamber 12c reaches the predetermined pressure $P_T$, when there are no delay times D1 and D2 and a period PR1 during which gas is output at the set flow rate V from the flow rate controller FC1 over the first time length t1 and a period PR2 during which gas is output at the set flow rate V from the flow rate controller FC1 over the second time length t2 are alternately repeated. In other words, the estimated time T3 is an estimated time length required until the pressure in the chamber 12c reaches the predetermined pressure $P_T$, when it is assumed that the waveform of the gas output from the flow rate controller FC1 is an ideal rectangular wave. In an exemplary embodiment, the estimated time T3 can be determined by calculating Equation (1).

$$T3=T1 \cdot (t1+t2)/t1 \qquad (1)$$

In the subsequent step ST15, a parameter representing a difference between the estimated time T3 and the second required time T2 is obtained. This parameter may be any value as long as it represents a difference between the estimated time T3 and the second required time T2. For example, the ratio of the estimated time T3 to the second necessary time T2 may be used as a parameter. Assuming that the value of the parameter when the second required time T2 and the estimated time T3 are the same as the reference value, the reference value when the ratio of the estimated time T3 to the second required time T2 is a parameter is 1 (100%). Further, the difference value between the estimated time T3 and the second required time T2 may be used as a parameter. In this case, the reference value of the parameter is 0. In this manner, since the parameter represents the difference between the estimated time T3 obtained under the assumption that there are no delay times D1 and D2 and the second required time T2 obtained by actually supplying the gas intermittently, the parameter depends on the delay times D1 and D2. Therefore, by obtaining the parameters in step ST15, it is possible to recognize the influence of the delay times D1 and D2 in intermittent gas supply of the flow rate controller FC1.

In the exemplary embodiment described above, the method MT1 is executed only for the flow rate controller FC1, but in an exemplary embodiment, the method MT1 can be executed sequentially for all the flow rate controllers FC.

Figure 7:
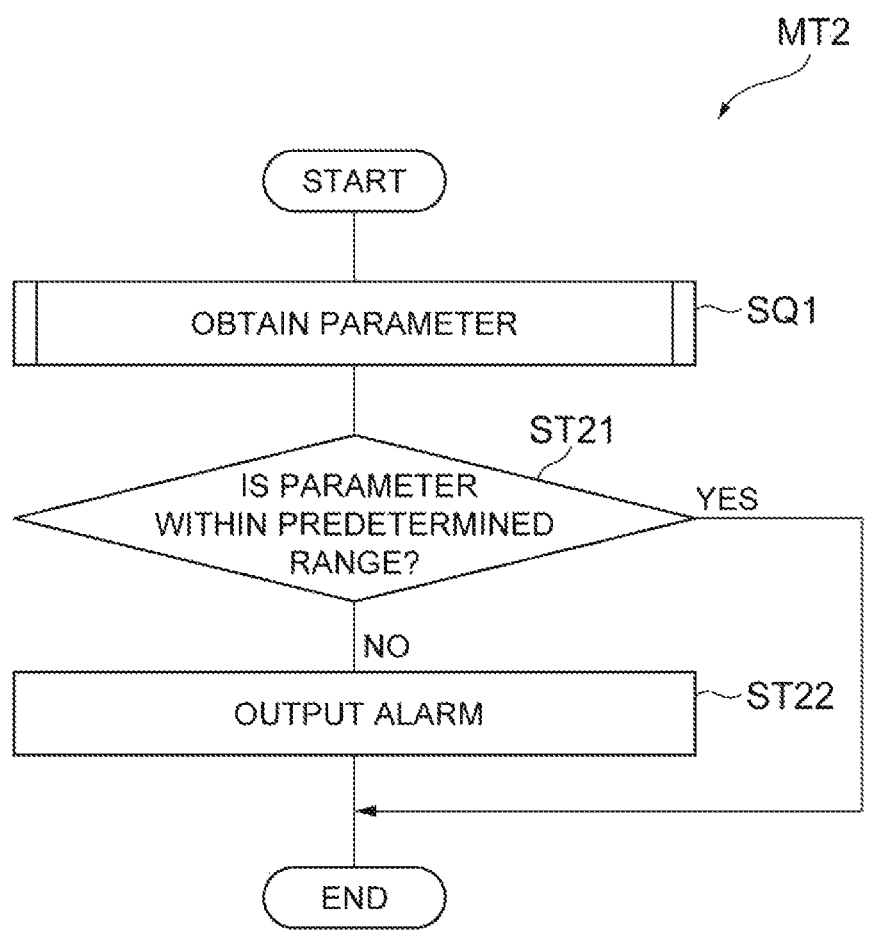
FIG. 7 is a flow diagram illustrating a method of inspecting a flow rate controller according to another exemplary embodiment.

Hereinafter, a method of inspecting a flow rate controller according to another exemplary embodiment will be described with reference to FIG. 7. Hereinafter, the differences from the method MT1 illustrated in FIG. 1 will be mainly described, and redundant explanation will be omitted. FIG. 7 is a flow diagram illustrating a method MT2 of inspecting a flow rate controller according to another exemplary embodiment.

As illustrated in FIG. 7, in the method MT2, the sequence SQ1 is first performed, and a parameter representing the difference between the estimated time T3 and the second necessary time T2 is obtained. The sequence SQ1 is the same as the sequence SQ1 described in the method MT1. In the method MT2, after the sequence SQ1, step ST21 is executed. In step ST21, it is determined whether or not the parameter obtained in the sequence SQ1 is within a predetermined range. Specifically, when the difference between the parameter obtained by performing the sequence SQ1 and the reference value is within a predetermined threshold value, it is determined that the parameter is within the predetermined threshold value. The predetermined threshold value is a predetermined value. In a case where the parameter is within the predetermined range, the process is terminated. On the other hand, in a case where the parameter obtained in the sequence SQ1 is not within the predetermined range, that is, in a case where the difference between the obtained parameter and the reference value is larger than the predetermined threshold value, an alarm is output in step ST22. When the parameter is not within the predetermined range, it is predicted that the delay time is large and the error between the amount of gas to be supplied to the chamber and the amount of gas actually supplied to the chamber is large due to the influence of the delay times D1 and D2. In the method MT2, since the alarm is output when the parameter is not within the predetermined range, it is possible to recognize the possibility that such an error occurs. Thus, maintenance of the flow rate controller FC1 can be urged.

Next, with reference to FIG. 8, a method of processing a workpiece according to an exemplary embodiment will be described. Hereinafter, a method of processing a workpiece using the plasma processing apparatus 10 illustrated in FIG. 2 will be described, but this method can be applied to any substrate processing apparatus.

FIG. 8 is a flow diagram illustrating a method of processing a workpiece according to an exemplary embodiment. The method MT3 illustrated in FIG. 8 adjusts the recipe data based on the parameters, and processes the workpiece (hereinafter, referred to as "wafer W") with the adjusted recipe data. Hereinafter, as an example of the method of processing the workpiece, a method of etching the antireflection film of the wafer W by using an atomic layer etching (ALE) method will be described. In the method MT3, first, step ST30 is executed.

Figure 9A:
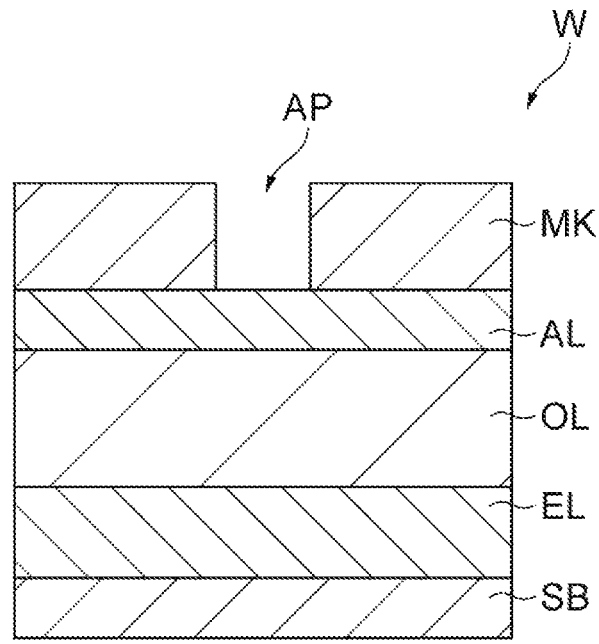
FIG. 9A and FIG. 9B are a cross-sectional view illustrating a workpiece before and during the execution of the method illustrated in FIG. 8.

In step ST30, a wafer W is prepared. FIG. 9A is a cross-sectional view illustrating an example of the wafer W prepared in the step ST30. The wafer W includes a substrate SB, a layer EL to be etched, an organic film OL, an antireflection film AL, and a mask MK. The layer EL to be etched is an insulating film such as silicon oxide ($SiO_2$) and is provided on the substrate SB. The organic film OL is a layer containing carbon such as a spin-on hard mask (SOH) layer, and is provided on the layer EL to be etched. The antireflection film AL is a silicon-containing antireflection film and is provided on the organic film OL.

The mask MK is provided on the antireflection film AL. The mask MK is a resist mask made of a resist material, and is manufactured by patterning a resist layer by, for example, a photolithography technique. The mask MK is, for example, an ArF resist. The mask MK partially covers the antireflection film AL, and an opening AP partially exposing the antireflection film AL is formed.

In the subsequent step ST31, a parameter representing the difference between the estimated time T3 and the second required time T2 is obtained for the flow rate controller FC1 (hereinafter referred to as "the first flow rate controller FC1") among the plurality of flow rate controllers FC. In step ST31, the parameter relating to the first flow rate controller FC1 is obtained by executing the sequence SQ1 of the method MT1 illustrated in FIG. 1, with the flow rate controller FC1 as the flow rate controller to be inspected. In the subsequent step ST32, a parameter representing the difference between the estimated time T3 and the second required time T2 is obtained for the flow rate controller FC2 (hereinafter referred to as "the second flow rate controller FC2") among the plurality of flow rate controllers FC. In step ST32, the parameter relating to the flow rate controller FC2 is obtained by executing the sequence SQ1 of the method MT1 illustrated in FIG. 1, with the second flow rate controller FC2 as the flow rate controller to be inspected.

In the subsequent step ST33, the recipe data relating to the first flow rate controller FC1 is adjusted. Recipe data for processing the wafer W is stored in the storage unit of the control unit Cnt. The recipe data includes a first time length t1, a second time length t2, and a first set flow rate V1 as data relating to the first flow rate controller FC1. As will be described later, when processing the wafer W, the first flow rate controller FC1 intermittently outputs the first gas according to the recipe data. In step ST33, in order to reduce the difference between the parameter relating to the first flow rate controller FC1 obtained in step ST31 and the reference value, at least one of the first time length t1, the second time length t2, and the first set flow rate V1 included in the recipe data is adjusted. For example, in a case where the parameter is the ratio of the second required time T2 to the estimated time T3, at least one of the first time length t1, the second time length t2, and first set flow rate V1 which are included in the recipe data is adjusted such that the parameter approaches 100%.

In step ST33, the recipe data can be adjusted using various methods. In an exemplary embodiment, in a case where the parameter obtained in step ST31 is not within the predetermined range, the first time length t1, the second time length t2, and the first set flow rate V1 may be adjusted by multiplying each of the first time length t1, the second time length t2, and the first set flow rate V1 by a coefficient which is determined in advance. In another exemplary embodiment, a table in which the parameter value, the coefficient related to the first time length t1, the coefficient related to the second time length t2, and the coefficient related to the first set flow rate V1 are associated with each other may be stored in the storage unit of the control unit Cnt. Then, the coefficient related to each of the first time length t1, the second time length t2, and the first set flow rate V1 corresponding to the parameter obtained in the step ST31 is acquired from the table, and the recipe data related to the first flow rate controller FC1 may be adjusted by multiplying the first time length t1, the second time length t2, and the first set flow rate V1 which are included in the recipe data by the obtained coefficients. In still another exemplary embodiment, the coefficient related to each of the first time length t1, the second time length t2, and the first set flow rate V1 is obtained by using a function having the parameter as a variable, and the recipe data related to the first flow rate controller FC1 may be adjusted by multiplying the first time length t1, the second time length t2, and the first set flow rate V1 which are included in the recipe data by the obtained coefficients, respectively. The first time length t1, the second time length t2, and the first set flow rate V1, which are adjusted, can be stored in the storage unit of the control unit Cnt as updated recipe data.

In the subsequent step ST34, the recipe data relating to the second flow rate controller FC2 is adjusted. The recipe data stored in the storage unit of the control unit Cnt includes a third time length t3, a fourth time length t4, and a second set flow rate V2, as data on the second flow rate controller FC2. As will be described later, when processing the wafer W, the second flow rate controller FC2 intermittently outputs the second gas according to the recipe data. In step ST34, in order to reduce the difference between the value of the parameter relating to the second flow rate controller FC2 obtained in step ST32 and the reference value of the parameter, at least one of the third time length t3, the fourth time length t4, and the second set flow rate V2 included in the recipe data is adjusted. The method of adjusting the third time length t3, the fourth time length t4, and the second set flow rate V2 is the same as the step ST33, so that the description thereof will be omitted again.

Next, in the method MT3, the sequence SQ2 is executed. The sequence SQ2 includes steps ST35 to ST42. In the sequence SQ2, step ST35 is executed first. In step ST35, the first gas is supplied from the first flow rate controller FC1 according to the adjusted recipe data. FIG. 10 is a diagram illustrating a flow rate of gas output from a gas supply system 42. As illustrated in FIG. 10, in step ST35, the first flow rate controller FC1 is controlled so that the control valve CV is opened over the adjusted first time length t1. Thus, the first gas is output from the first flow rate controller FC1 at a flow rate corresponding to the adjusted first set flow rate V1.

The first gas output from the first flow rate controller FC1 in step ST35 is etchant gas suitable for etching the antireflection film AL containing silicon. The first gas may be a mixed gas of a fluorocarbon-based gas and a rare gas, for example, $C_xF_y$ gas and Ar gas. $C_xF_y$ can be $CF_4$. In the subsequent step ST36, first high-frequency power for plasma generation is supplied from the first high-frequency power supply 62 to the upper electrode 30 in a state where the output of the first gas is continued. In addition, the pressure in the processing space S is adjusted to the pressure designated in the recipe data by the exhaust device 50. Thereby, a plasma of the first gas is generated in the chamber 12c. The plasma of the first gas contains carbon radicals and fluorine radicals.

Figure 9B:
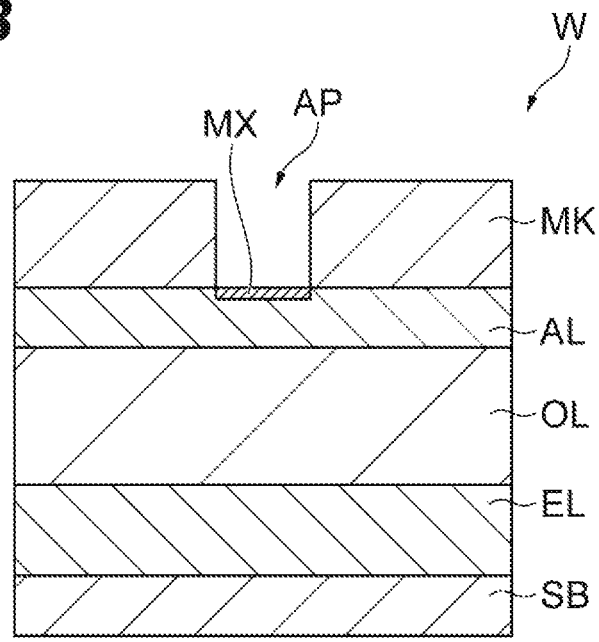

When plasma of the first gas is generated in the chamber 12c, carbon radicals and fluorine radicals contained in the plasma are supplied to the surface of the antireflection film AL. Thus, as illustrated in FIG. 9B, a mixed layer MX containing atoms constituting the antireflection film AL, carbon radicals and fluorine radicals is formed on the surface of the antireflection film AL.

In the subsequent step ST37, the first flow rate controller FC1 is controlled so that the control valve CV is closed over the adjusted second time length t2. Thus, the output of the first gas from the first flow rate controller FC1 is stopped in a period including a second time length t2. In the subsequent step ST38, the purge gas is supplied to the chamber 12c within a period in which the output of the first gas is stopped in the step ST36. As the purge gas, for example, an inert gas such as a nitrogen gas or a rare gas (for example, Ar or the like) is used. In step ST38, the pressure regulating valve 51 is opened and the exhaust device 50 is operated. Thus, the first gas in the chamber 12c is exhausted.

In subsequent step ST39, the second gas is supplied from the second flow rate controller FC2 according to the adjusted recipe data. As illustrated in FIG. 10, in step ST39, the control valve CV is opened over the adjusted second time length t2. In the period including the adjusted second time length t2, the second gas adjusted to the adjusted second set flow rate V2 is output from the second flow rate controller FC2. The step ST39 is performed within the period during which the supply of the first gas from the flow rate controller FC1 is stopped. The second gas output from the second flow rate controller FC2 contains rare gas, and may include, for example, Ar gas.

Figure 11A:
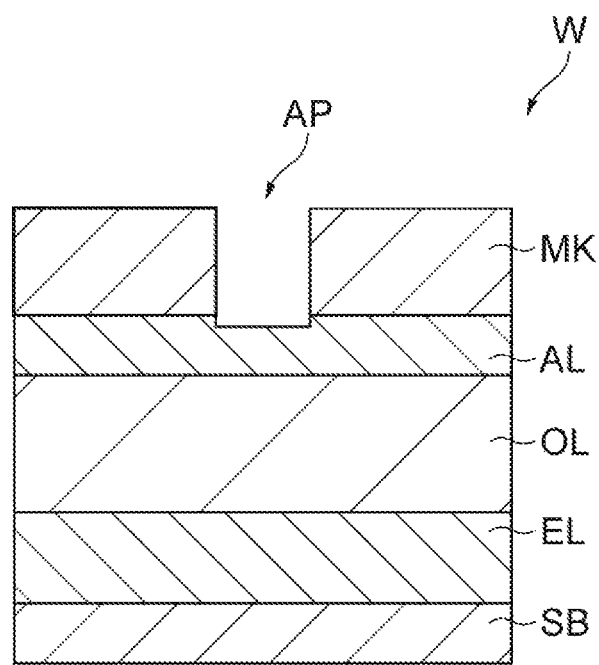
FIG. 11A and FIG. 11B are a cross-sectional view illustrating a workpiece during and after the execution of the method illustrated in FIG. 8.

In the subsequent step ST40, first high-frequency power for plasma generation is supplied from the first high-frequency power supply 62 to the upper electrode 30 in a state where the output of second gas is continued in step ST39. In addition, the pressure in the space in the chamber 12c is adjusted to the pressure designated in the recipe data by the exhaust device 50. Thereby, a plasma of the second gas is generated in the chamber 12c. Further, in step ST40, high-frequency bias power is supplied from the second high-frequency power supply 64 to the lower electrode LE. By supplying the high-frequency bias power to the lower electrode LE, ions of atoms of the second gas (for example, ions of Ar atoms) generated in the chamber 12c are attracted toward the lower electrode LE, and collide with the mixed layer MX formed on the surface of the antireflection film AL. When ions of the second gas collide with the mixed layer MX, the mixed layer MX is removed by kinetic energy as illustrated in FIG. 11A.

In the subsequent step ST41, the control valve CV is closed for the adjusted fourth time length t4. Thus, the output of the second gas from the second flow rate controller FC2 is stopped in a period including a fourth time length t4. In the subsequent step ST42, the purge gas is supplied to the chamber 12c within a period in which the outputs of the first gas and the second gas are stopped. In step ST42, the pressure regulating valve 51 is opened and the exhaust device 50 is operated. Thus, the second gas in the chamber 12c is exhausted.

Figure 11B:
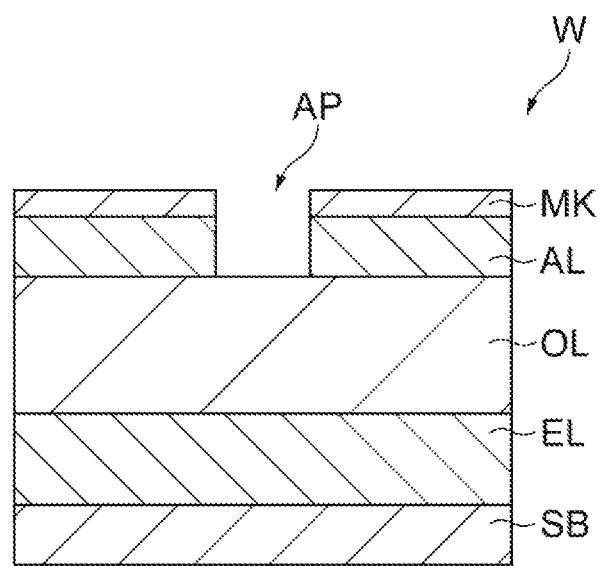

In the subsequent step ST43, it is determined whether or not the termination condition is satisfied. For example, in step ST43, it is determined that the termination condition is satisfied by repeating the sequence SQ2 by the designated number of times. In a case where it is determined in step ST43 that the termination condition is not satisfied, the sequence SQ2 is repeated until the termination condition is satisfied. By repeating the sequence SQ2 in this manner, as illustrated in FIG. 10, the first gas is intermittently output from the first flow rate controller FC1, and the second gas is intermittently output from the second flow rate controller FC2. Each time the sequence SQ2 is repeated, the mixed layer MX is formed and removed on the antireflection film AL. Therefore, by repeating the sequence SQ2, the antireflection film AL under the opening AP of the mask MK is precisely etched as illustrated in FIG. 11B.

In the method MT3 described above, the recipe data is adjusted so that the difference between the obtained parameter and the reference value of the parameter is reduced, and the first flow rate controller FC1 and the second flow rate control Unit FC2 are controlled according to the adjusted recipe data. This makes it possible to reduce the error between the amounts of gas output from the first flow rate controller FC1 and the second flow rate controller FC2 and the amount of gas to be supplied to the chamber. Therefore, by reducing such an error, it is possible to improve the processing accuracy of the workpiece.

Although the method of obtaining the output flow rate of the flow rate controller and the method of processing the workpiece according to the various exemplary embodiments have been described above, the present invention is not limited to the above-described exemplary embodiments, and various modifications can be configured within the scope without changing the gist of the invention. For example, the flow rate controller FC illustrated in FIG. 2 is a pressure type flow rate controller, but the flow rate controller FC may be a thermal type mass flow rate controller.

What is claimed is:

1. A method for inspecting a flow rate controller which adjusts a flow rate of gas to be supplied to a chamber of a substrate processing apparatus,
   wherein the substrate processing apparatus comprises:
   a chamber body providing the chamber,
   a pressure gauge configured to measure a pressure in the chamber,
   an exhaust device configured to depressurize the chamber,
   a valve provided between the chamber body and the exhaust device, and
   a gas supply system configured to supply gas to the chamber, the gas supply system including the flow rate controller which outputs gas at a flow rate corresponding to a designated set flow rate,
   the method comprising:
   a first step of performing a continuous output of gas at the flow rate corresponding to the set flow rate from the flow rate controller, in a state where a control valve of the flow rate controller is opened, after the chamber is depressurized by the exhaust device;
   a second step of closing the valve, in a state where the continuous output of gas is performed;
   a third step of obtaining a first pressure rise characteristic representing a temporal change of a pressure value in the chamber due to the continuous output of gas after the valve is closed in the second step;
   a fourth step of performing an intermittent output of gas from the flow rate controller by alternately repeating a first period of opening the control valve for a first time length and a second period of closing the control valve for a second time length such that gas is to be output at a flow rate corresponding to the set flow rate, the fourth step being performed after the chamber is depressurized by the exhaust device;
   a fifth step of closing the valve, in a state where the intermittent output of the gas is performed;
   a sixth step of obtaining a second pressure rise characteristic representing a temporal change of a pressure value in the chamber due to the intermittent output of the gas after the valve is closed in the fifth step;
   a seventh step of obtaining a third pressure rise characteristic representing a temporal change of a pressure value obtained by subtracting a temporal change of a pressure value of the chamber when the valve and the control valve are closed, from a temporal change of a pressure value specified by the first pressure rise characteristic;
   an eighth step of obtaining a fourth pressure rise characteristic representing a temporal change of a pressure value obtained by subtracting a temporal change of a pressure value of the chamber when the valve and the control valve are closed, from a temporal change of a pressure value specified by the second pressure rise characteristic;
a ninth step of obtaining a first required time required from a start of the continuous output of gas by the flow rate controller until a predetermined pressure is reached, from a temporal change of a pressure value specified by the third pressure rise characteristic;
a tenth step of obtaining a second required time required from a start of the intermittent output of the gas by the flow rate controller until the predetermined pressure is reached, from a temporal change of a pressure value specified by the fourth pressure rise characteristic;
an 11th step of obtaining an estimated time from a start of the intermittent output of the gas by the flow rate controller until the predetermined pressure is reached, in a case where the intermittent output of the gas is performed in the fourth step assuming that there is no delay time for intermittent supply of gas by the flow rate controller; and
a 12th step of obtaining a parameter representing a difference between the estimated time and the second required time.

2. The method according to claim 1,
wherein when assuming the estimated time as T3, the estimated time T3 is obtained by Equation (1), $$T3=T1\cdot(t1+t2)/t1 \qquad (1)$$

wherein T1 is the first required time, t1 is the first time length, and t2 is the second time length in Equation (1).

3. The method according to claim 1, further comprising:
a 13th step of outputting an alarm when a difference between the parameter obtained in the 12th step and a reference value is greater than a predetermined threshold value.

4. A method for processing a workpiece by using a substrate processing apparatus,
wherein the substrate processing apparatus comprises:
a chamber body providing a chamber,
a pressure gauge configured to measure a pressure in the chamber,
an exhaust device configured to depressurize the chamber,
a valve provided between the chamber body and the exhaust device, and
a gas supply system configured to supply gas to the chamber, the gas supply system including one or more flow rate controllers which control a flow rate of gas,
the method comprising:
a first step of performing a continuous output of first gas at a flow rate corresponding to a first set flow rate designated in recipe data from a first flow rate controller, in a state where a control valve of the first flow rate controller among the one or more flow rate controllers is opened, after the chamber is depressurized by the exhaust device;
a second step of closing the valve, in a state where the continuous output of the first gas from the first flow rate controller is performed;
a third step of obtaining a first pressure rise characteristic representing a temporal change of a pressure value in the chamber due to the continuous output of the first gas from the first flow rate controller after the valve is closed in the second step;
a fourth step of performing the intermittent output of the first gas from the first flow rate controller, by alternately repeating a first period of opening a control valve of the first flow rate controller for a first time length and a second period of closing the control valve of the first flow rate controller for a second time length such that the first gas is to be output at a flow rate according to the first set flow rate, the fourth step being performed after the chamber is depressurized by the exhaust device;
a fifth step of closing the valve, in a state where the intermittent output of the first gas from the first flow rate controller is performed;
a sixth step of obtaining a second pressure rise characteristic representing a temporal change of a pressure value in the chamber due to the intermittent output of the first gas from the first flow rate controller after the valve is closed in the fifth step;
a seventh step of obtaining a third pressure rise characteristic representing a temporal change of a pressure value obtained by subtracting a temporal change of a pressure value of the chamber when the valve and the control valve are closed, from a temporal change of a pressure value specified by the first pressure rise characteristic;
an eighth step of obtaining a fourth pressure rise characteristic representing a temporal change of a pressure value obtained by subtracting a temporal change of a pressure value of the chamber when the valve and the control valve are closed, from a temporal change of a pressure value specified by the second pressure rise characteristic;
a ninth step of obtaining a first required time required from a start of the continuous output of the first gas from the first flow rate controller until a predetermined pressure is reached, from a temporal change of a pressure value specified by the third pressure rise characteristic;
a tenth step of obtaining a second required time required from a start of the intermittent output of the first gas from the first flow rate controller until the predetermined pressure is reached, from a temporal change of a pressure value specified by the fourth pressure rise characteristic;
an 11th step of obtaining an estimated time from a start of the intermittent output of the first gas from the first flow rate controller until the predetermined pressure is reached, in a case where the intermittent output of the first gas is performed in the fourth step assuming that there is no delay time in the intermittent output of the first gas from the first flow rate controller;
a 12th step of obtaining a parameter representing a difference between the estimated time obtained in the 11th step and the second required time;
a 13th step of adjusting at least one of the first time length, the second time length, and the first set flow rate, which are included in the recipe data, such that a difference between the parameter obtained in the 12th step and a reference value decreases; and
a 14th step of performing the intermittent output of the first gas from the first flow rate controller and processing the workpiece in the chamber by the output first gas, by alternately repeating the first period and the second period, according to recipe data in which at least one of the first time length, the second time length, and the first set flow rate is adjusted in the 13th step.

5. The method according to claim 4, further comprising:
a 15th step of performing a continuous output of second gas at a flow rate corresponding to a second set flow rate designated in the recipe data from a second flow rate controller, in a state where a control valve of the second flow rate controller among the one or more flow rate controllers is opened, after the chamber is depressurized by the exhaust device;

a 16th step of closing the valve, in a state where continuous output of the second gas from the second flow rate controller is performed;

a 17th step of obtaining a fifth pressure rise characteristic representing a temporal change of a pressure value in the chamber due to the continuous output of the second gas from the second flow rate controller after the valve is closed in the 16th step;

an 18th step of performing the intermittent output of the second gas from the second flow rate controller, by alternately repeating a third period of opening a control valve of the second flow rate controller for a third time length and a fourth period of closing the control valve of the second flow rate controller for a fourth time length such that the second gas is to be output at a flow rate according to the second set flow rate, the 18th step being performed after the chamber is depressurized by the exhaust device;

a 19th step of closing the valve, in a state where the intermittent output of the second gas from the second flow rate controller is performed;

a 20th step of obtaining a sixth pressure rise characteristic representing a temporal change of a pressure value in the chamber due to the intermittent output of the second gas from the second flow rate controller after the valve is closed in the 19th step;

a 21th step of obtaining a seventh pressure rise characteristic representing a temporal change of a pressure value obtained by subtracting a temporal change of a pressure value of the chamber when the valve and the control valve are closed, from a temporal change of a pressure value specified by the fifth pressure rise characteristic;

a 22nd step of obtaining an eighth pressure rise characteristic representing a temporal change of a pressure value obtained by subtracting a temporal change of a pressure value of the chamber when the valve and the control valve are closed, from a temporal change of a pressure value specified by the sixth pressure rise characteristic;

a 23rd step of obtaining a fourth required time required from a start of the continuous output of the second gas from the second flow rate controller until a predetermined pressure is reached, from a temporal change of a pressure value specified by the seventh pressure rise characteristic;

a 24th step of obtaining a fifth required time required from a start of the intermittent output of the first gas from the first flow rate controller until the predetermined pressure is reached, from a temporal change of a pressure value specified by the eighth pressure rise characteristic;

a 25th step of obtaining an estimated time from a start of the intermittent output of the second gas from the second flow rate controller until the predetermined pressure is reached, in a case where the intermittent output of the second gas is performed in the 18th step assuming that there is no delay time in the intermittent output of the second gas from the second flow rate controller;

a 26th step of obtaining a parameter representing a difference between the estimated time obtained in the 25th step and the fifth required time;

a 27th step of adjusting at least one of the third time length, the fourth time length, and the second set flow rate, which are included in the recipe data, such that a difference between the parameter obtained in the 26th step and the reference value decreases; and a 28th step of performing the intermittent output of the second gas from the second flow rate controller and processing the workpiece in the chamber by the output second gas, by alternately repeating the third period and the fourth period, according to the recipe data in which at least one of the third time length, the fourth time length, and the second set flow rate is adjusted in the 27th step, wherein the first step to the 13th step are executed before the 14th step, and the 15th step to the 27th step are executed before the 28th step, and wherein the 14th step and the 28th step are executed alternately and repeatedly.

6. A method for inspecting a flow rate controller which adjusts a flow rate of gas to be supplied to a chamber of a substrate processing apparatus, wherein the substrate processing apparatus comprises:

a chamber body providing the chamber, a pressure gauge configured to measure a pressure in the chamber, an exhaust device configured to depressurize the chamber, a valve provided between the chamber body and the exhaust device, and a gas supply system configured to supply gas to the chamber, the gas supply system including the flow rate controller which outputs gas at a flow rate corresponding to a designated set flow rate, the method comprising:

a first step of performing a continuous output of gas at the flow rate corresponding to the set flow rate from the flow rate controller, in a state where a control valve of the flow rate controller is opened, after the chamber is depressurized by the exhaust device;

a second step of closing the valve, in a state where the continuous output of gas is performed;

a third step of obtaining a first pressure rise characteristic representing a temporal change of a pressure value in the chamber due to the continuous output of gas after the valve is closed in the second step;

a fourth step of performing an intermittent output of gas from the flow rate controller by alternately repeating a first period of opening the control valve for a first time length and a second period of closing the control valve for a second time length such that gas is to be output at a flow rate corresponding to the set flow rate, the fourth step being performed after the chamber is depressurized by the exhaust device;

a fifth step of closing the valve, in a state where the intermittent output of the gas is performed;

a sixth step of obtaining a second pressure rise characteristic representing a temporal change of a pressure value in the chamber due to the intermittent output of the gas after the valve is closed in the fifth step;

a seventh step of obtaining a first required time required from a start of the continuous output of gas by the flow rate controller until a predetermined pressure is reached, from a temporal change of a pressure value specified by the first pressure rise characteristic;

an eighth step of obtaining a second required time required from a start of the intermittent output of the gas by the flow rate controller until the predetermined pressure is reached, from a temporal change of a pressure value specified by the second pressure rise characteristic;

a ninth step of obtaining an estimated time from a start of the intermittent output of the gas by the flow rate controller until the predetermined pressure is reached, in a case where the intermittent output of the gas is performed in the fourth step assuming that there is no delay time for intermittent supply of gas by the flow rate controller; and a tenth step of obtaining a parameter representing a difference between the estimated time and the second required time.

7. The method according to claim 6, further comprising:

an 11th step of obtaining a third pressure rise characteristic representing a temporal change of a pressure value obtained by subtracting a temporal change of a pressure value of the chamber when the valve and the control valve are closed, from a temporal change of a pressure value specified by the first pressure rise characteristic; and a 12th step of obtaining a fourth pressure rise characteristic representing a temporal change of a pressure value obtained by subtracting a temporal change of a pressure value of the chamber when the valve and the control valve are closed, from a temporal change of a pressure value specified by the second pressure rise characteristic.

8. The method according to claim 6, wherein when assuming the estimated time as T3, the estimated time T3 is obtained by Equation (1), $$T3 = T1 \cdot (t1 + t2)/t1 \tag{1}$$

wherein T1 is the first required time, t1 is the first time length, and t2 is the second time length in Equation (1).

9. The method according to claim 6, further comprising:

a 13th step of outputting an alarm when a difference between the parameter obtained in the tenth step and a reference value is greater than a predetermined threshold value.

* * * * *